(12) United States Patent
Wauke et al.

(10) Patent No.: US 10,840,789 B2
(45) Date of Patent: Nov. 17, 2020

(54) VIBRATION GENERATION DEVICE AND ELECTRONIC APPARATUS

(71) Applicant: ALPS ALPINE CO., LTD., Tokyo (JP)

(72) Inventors: Tomokuni Wauke, Miyagi (JP); Takashi Ogihara, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/534,054

(22) Filed: Aug. 7, 2019

(65) Prior Publication Data
US 2019/0363623 A1 Nov. 28, 2019

Related U.S. Application Data

(63) Continuation of application No. PCT/JP2018/007217, filed on Feb. 27, 2018.

(30) Foreign Application Priority Data

Mar. 2, 2017 (JP) .................................. 2017-039613

(51) Int. Cl.
*H02K 33/00* (2006.01)
*H02K 33/18* (2006.01)
(Continued)

(52) U.S. Cl.
CPC ............. *H02K 33/18* (2013.01); *B06B 1/045* (2013.01); *H05K 1/0277* (2013.01); *H05K 1/181* (2013.01);
(Continued)

(58) Field of Classification Search
CPC ............ H02K 33/00; H02K 1/34; H02K 5/04; H02K 5/02; H02K 33/18; B06B 1/045;
(Continued)

(56) References Cited

U.S. PATENT DOCUMENTS 8,097,988 B2 * 1/2012 Kim ...................... H02K 33/16
310/15
8,288,899 B2 * 10/2012 Park ...................... H02K 33/16
310/25

(Continued)

FOREIGN PATENT DOCUMENTS

JP   H11-150385    6/1999
JP   2008-310927   12/2008
(Continued)

OTHER PUBLICATIONS

International Search Report dated Jun. 5, 2018 in PCT/JP2018/007217 filed on Feb. 27, 2018.

*Primary Examiner* — Thanh Lam
(74) *Attorney, Agent, or Firm* — IPUSA, PLLC

(57) ABSTRACT

A vibration generation apparatus includes a casing, a magnet attached in the casing, a vibrator having a coil that vibrates in the casing, an elastic support member connected to the casing and holding the vibrator in the casing, and a flexible interconnect member. One end of the flexible interconnect member is connected to the electric wire of the coil, and the other end of the flexible interconnect member protrudes to the outside of the casing. The casing is provided with an opening through which the interconnect member passes, and the interconnect member is supported by a support in the casing.

13 Claims, 23 Drawing Sheets

(51) Int. Cl.
 *B06B 1/04* (2006.01)
 *H05K 1/02* (2006.01)
 *H05K 1/18* (2006.01)
 *A63F 13/285* (2014.01)

(52) U.S. Cl.
 CPC .... *A63F 13/285* (2014.09); *H05K 2201/1009* (2013.01)

(58) Field of Classification Search
 CPC ................ H05K 1/0277; H05K 1/181; H05K 2201/1009; A63F 13/285
 USPC .............................................. 310/15, 25, 71
 See application file for complete search history.

(56) References Cited

U.S. PATENT DOCUMENTS

| 8,941,273 | B2 | 1/2015 | Kim et al. | |
|---|---|---|---|---|
| 2011/0309691 | A1* | 12/2011 | Park | H02K 33/16 310/25 |
| 2013/0278674 | A1 | 10/2013 | Ota | |
| 2016/0181900 | A1* | 6/2016 | Xu | H02K 33/02 310/12.27 |

FOREIGN PATENT DOCUMENTS

| JP | 2010-003933 | 1/2010 |
|---|---|---|
| JP | 2012-073655 | 4/2012 |
| JP | 2013-220657 | 10/2013 |
| JP | 2016-096677 | 5/2016 |

* cited by examiner

VIBRATION GENERATION DEVICE AND ELECTRONIC APPARATUS

CROSS-REFERENCE TO RELATED APPLICATIONS

This application is a continuation application of International Application No. PCT/JP2018/007217 filed on Feb. 27, 2018 and designated the U.S., which is based upon and claims priority to Japanese Patent Application No. 2017-039613 filed on Mar. 2, 2017, the entire contents of which are incorporated herein by reference.

BACKGROUND OF THE INVENTION

1. Field of the Invention

The disclosed embodiments relate to a vibration generation device and an electronic apparatus.

2. Description of the Related Art

Some electronic apparatuses, such as portable information terminals, game consoles, or the like, use vibration generation devices that generate vibration, including vibration for notifying an incoming call to the portable information terminal, vibration for providing a haptic feedback from the game console, or the like.

The vibration generation devices for such use include a vibration generation device, such as that described in Japanese Laid-Open Patent Publication No. 2016-96677, for example, which has a permanent magnet and an electromagnet provided inside a casing, applies an alternating current to the electromagnet to generate a magnetic field with a polarity that alternately changes, and generates the vibration by alternately generating an attracting force and a repulsive force between the permanent magnet and the electromagnet.

As described above, in the vibration generation device, the electromagnet is provided inside the casing, and thus, a driving circuit, which generates the alternating current and is provided outside the casing, needs to be electrically connected to the electromagnet. Flexible Printed Circuits (FPCs) that are flexible, or the like, are used to provide the electrical connection between the outside of the casing and the electromagnet inside the casing, however, there are cases where parts of the FPC contact each other, or the FPC contacts a member that forms the vibration generation device, inside the vibration generation device. For this reason, when the vibration generation device generates vibration larger than normal for a long period of time, or continues to generate the vibration greatly exceeding a designed life, frictional wear of the FPC may occur, to expose an interconnect, or to break the interconnect. When the interconnect becomes exposed or breaks, it may no longer be possible to generate the vibration, to limit life extension of the vibration generation device.

Accordingly, in the vibration generation devices that use the FPC, there are demands to further extend the life, and achieve a high reliability.

SUMMARY OF THE INVENTION

It is an object in one aspect of the embodiments to provide a vibration generation device and an electronic apparatus, which use a FPC but can further extend the life thereof and achieve a high reliability.

According to one aspect of the embodiments, a vibration generation device includes a casing; a magnet mounted inside the casing; a vibrator that includes a coil and vibrates inside the casing; an elastic support member that is connected to the casing and supports the vibrator inside the casing; and a flexible interconnect member having one end connected to a wire of the coil, and the other end protruding outside the casing, wherein the casing is provided with an opening through which the interconnect member passes, and wherein the interconnect member is supported by a support inside the casing.

According to another aspect of the embodiments, an electronic apparatus includes the above mentioned vibration generation device according to one aspect of the embodiments.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF THE EMBODIMENTS

Figure 1:
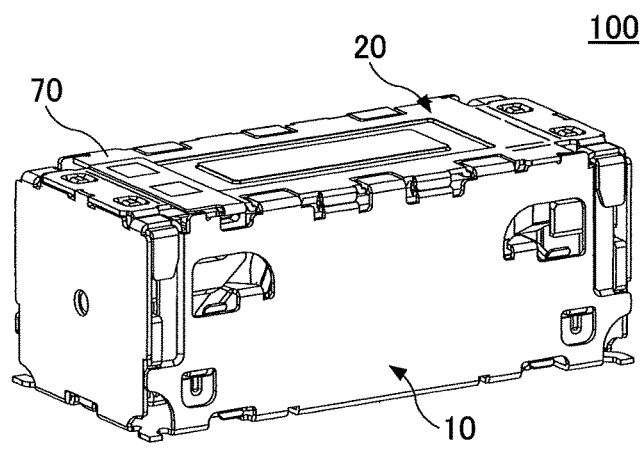
FIG. 1 is a perspective view of the vibration generation device according to one embodiment.
Figure 1:
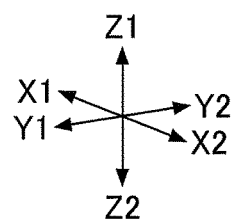

Embodiments will be described in the following. The same members or the like are designated by the same reference numerals, and a description thereof will be omitted. In addition, in this application, a X1-X2 direction, a Y1-Y2 direction, and a Z1-Z2 direction are mutually perpendicular directions. Further, a plane including the X1-X2 direction and the Y1-Y2 direction is referred to as a XY-plane, a plane including the Y1-Y2 direction and the Z1-Z2 direction is referred to as a YZ-plane, and a plane including the Z1-Z2 direction and the X1-X2 direction is referred to as a ZX-plane.

The vibration generation device according to one embodiment is mounted on apparatuses which transmit information to a user by vibration, such as electronic apparatuses including portable information terminals, game consoles, or the like, operation panels of automobiles or the like, or the like, and for example, the vibration generated by the vibration generation device is used as vibration for providing a feedback with respect to a user operation, vibration for notifying an incoming call to the portable information terminal, vibration for providing a haptic feedback from the game console, or the like.

Figure 2:
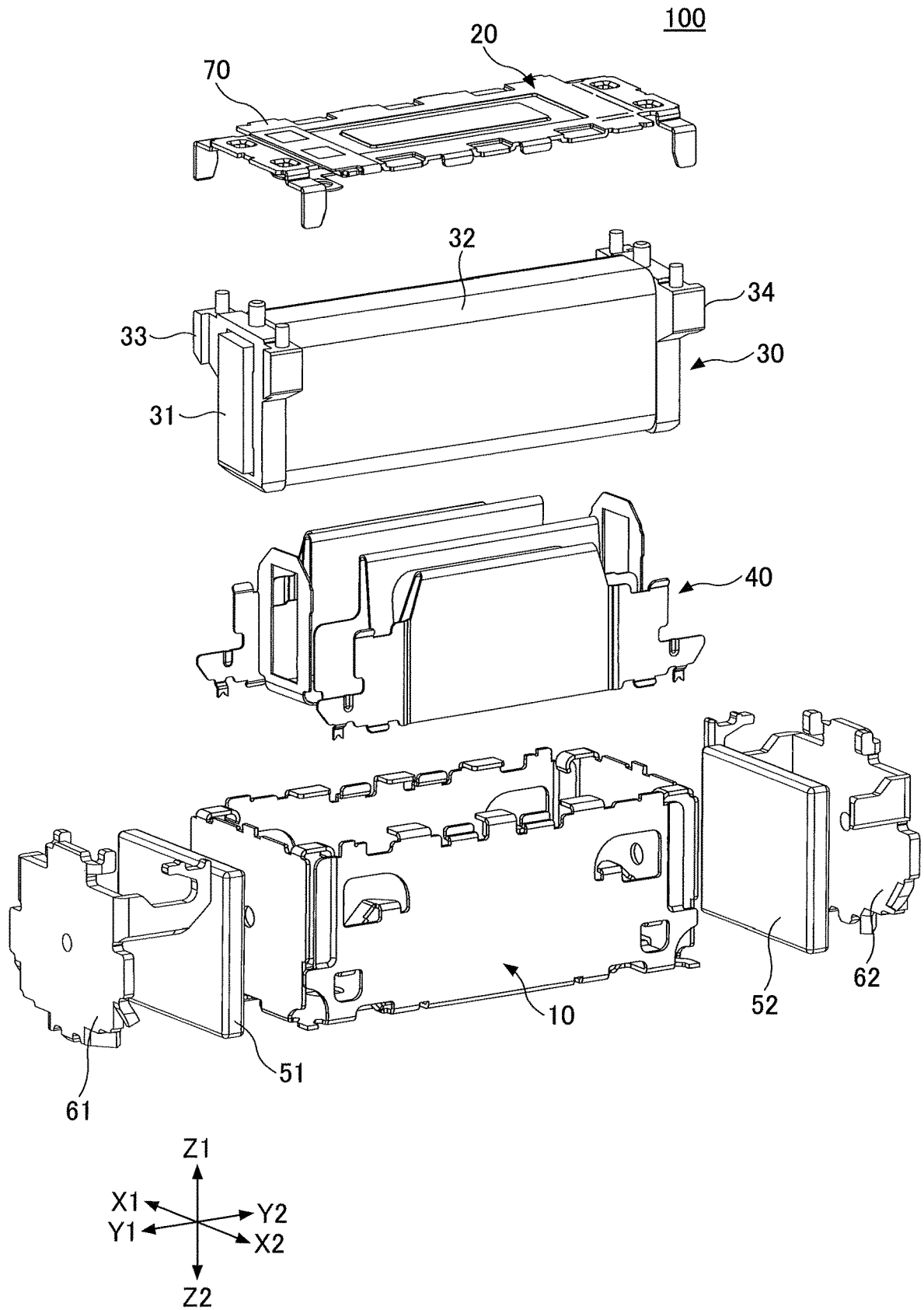
FIG. 2 is a disassembled perspective view of the vibration generation device according to one embodiment.

A vibration generation device 100 according to one embodiment includes a casing body 10, a lid 20, a vibrator 30, an elastic support member 40, permanent magnets 51 and 52, yokes 61 and 62, or the like, as illustrated in FIG. 1 and FIG. 2. A casing of the vibration generation device according to one embodiment is formed by the casing body 10 and the lid 20.

The casing body 10 is formed by processing a metal plate, and has an approximately rectangular parallelepiped box shape formed from a bottom face and four side faces surrounding the bottom face, and members for forming the vibration generation device are inserted into the casing body 10 through an open part. The casing body 10 is formed to the approximately rectangular parallelepiped shape having the Y1-Y2 direction as a longitudinal direction, and the X1-X2 direction as a lateral direction, and the four side faces include two opposing side faces in the longitudinal direction along the Y1-Y2 direction, that is, in the longitudinal direction of the bottom face, and two opposing side faces in the lateral direction along the X1-X2 direction, that is, in the lateral direction of the bottom face.

The lid 20 is a plate-shaped member having an approximately rectangular shape that is formed by processing a metal plate, and the lid 20 is formed so that the lid 20 can cover the open part of the casing body 10.

Figure 3:
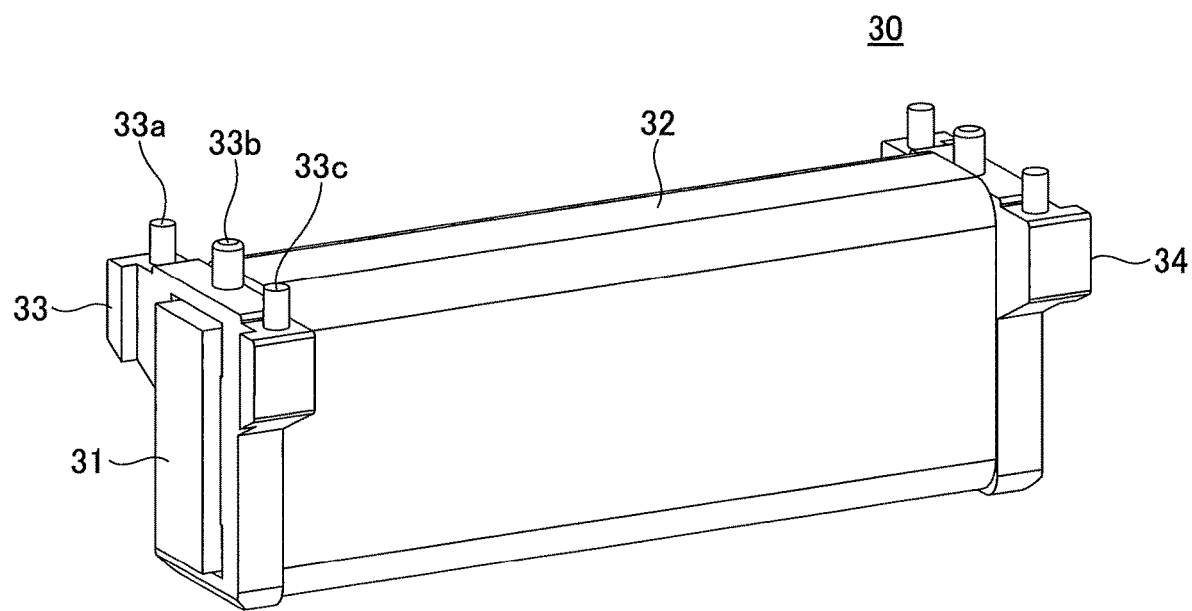
FIG. 3 is a perspective view of a vibrator according to one embodiment.

As illustrated in FIG. 3, the vibrator 30 is an electromagnet, and includes a magnetic core 31, a coil 32 formed by a wire that is wound around the magnetic core 31, flanges 33 and 34, or the like. The magnetic core 31 is formed by a ferromagnetic material such as iron or the like, and has a prism shape. The coil 32 is formed by winding the wire approximately perpendicularly with respect to the longitudinal direction of the magnetic core 31, that is, the Y1-Y2 direction. The flanges 33 and 34 are respectively mounted near both ends along the longitudinal direction of the magnetic core 31. Three projections 33a, 33b, and 33c are provided on the upper face side, that is, the Z1-direction side of the flange 33, and the projection 33a and the projection 33c are used as terminals respectively electrically connected to both ends of the wire forming the coil 32, although not illustrated in the drawings.

Although not illustrated, electrode terminals on one side of a FPC 70 are connected to the projections 33a and 33c to which the ends of the wire are electrically connected. In addition, an external circuit that is not illustrated is connected to the other side of the FPC 70, and the external circuit that is not illustrated supplies a current to the coil 32 via the FPC 70. Hence, one side of the FPC 70 is connected by soldering or the like to the projections 33a and 33c to which the ends of the wire forming the coil 32 are electrically connected, and the other side of the FPC 70 is mounted on the face of the lid 20 forming the outer side of the casing, so that a part between the one end and the other end of the FPC 70 passes through a gap between the casing body 10 and the lid 20. Accordingly, the electrode terminals on the other side of the FPC 70 are connected to the external circuit that is not illustrated. Although the described embodiments use the FPC 70, any interconnect member having flexibility may be used, and for example, a flat cable or the like may be used in place of the FPC.

Figure 4:
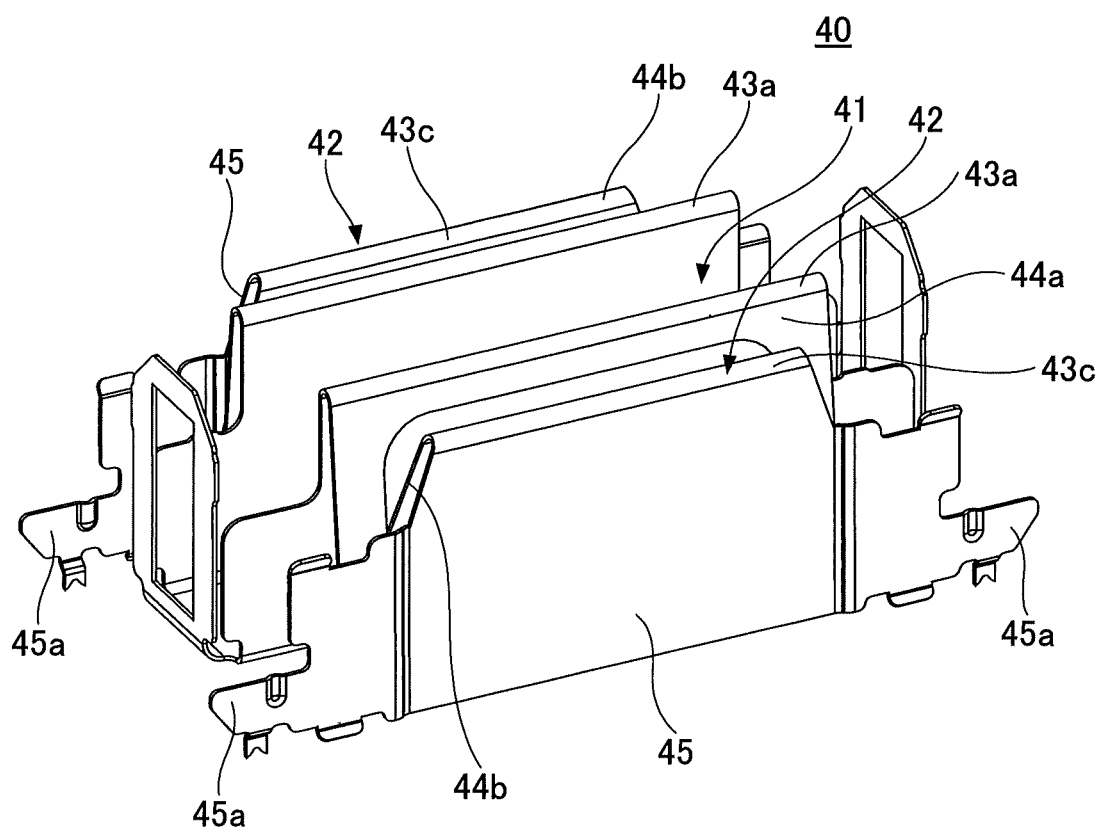
FIG. 4 is a perspective view of an elastic support member according to one embodiment.
Figure 5:
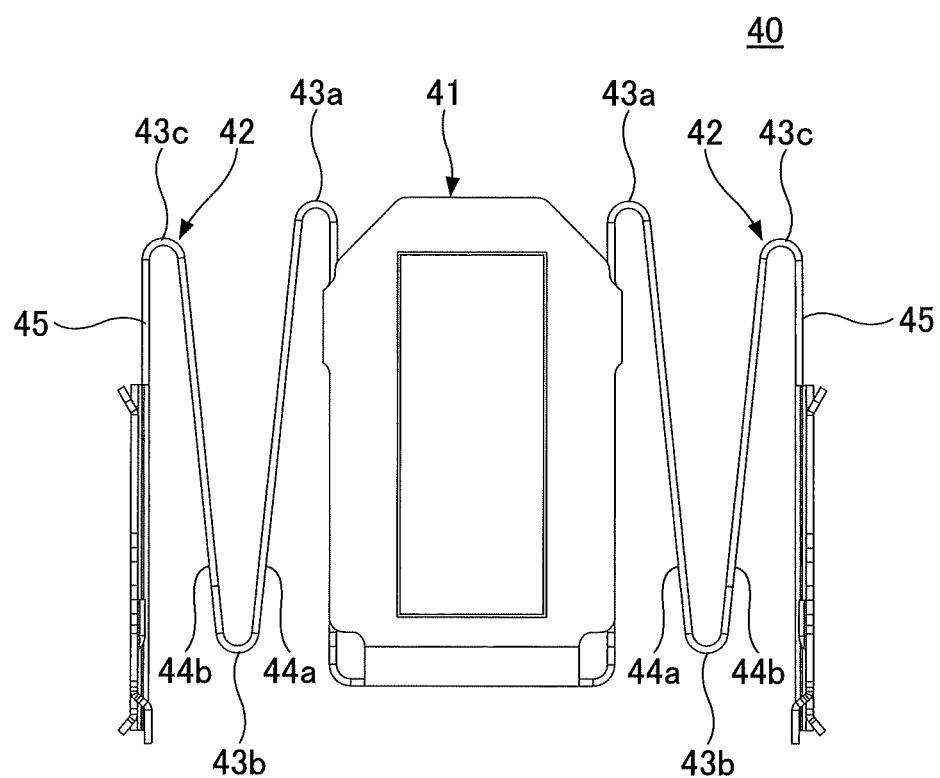
FIG. 5 is a front view of the elastic support member according to one embodiment.
Figure 5:
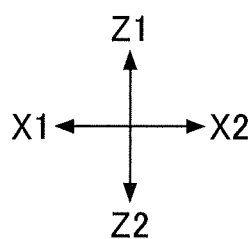

As illustrated in FIG. 4 and FIG. 5, the elastic support member 40 is formed by processing a metal plate having spring properties into a predetermined shape, and is formed by a holder part 41 into which the vibrator 30 is inserted, and a spring part 42 provided on both sides of the holder part 41. FIG. 4 is a perspective view of the elastic support member 40, and FIG. 5 is a front view.

The spring part 42 is formed by folding a metal plate, which is long along the X1-X2 direction a plurality of times along the Y1-Y2 direction. Between the two spring parts 42, one spring part 42 is formed on the X1-direction side of the holder part 41, and the other spring part 42 is formed on the X2-direction side of the holder part 41.

More particularly, as illustrated in FIG. 5, the spring part 42 includes three folded parts 43a, 43b, and 43x, two flat parts 44a and 44b, and a connecting part 45. Each of the folded parts 43a, 43b, and 43c is folded along the Y1-Y2 direction, the flat part 44a is formed between the folded part 43a and the folded part 43b, and the flat part 44b is formed between the folded part 43b and the folded part 43c. The flat parts 44a and 44b are formed to an approximately rectangular shape when viewed from the X1-direction side or the X2-direction side.

A leaf spring having a folded structure, such as the elastic support member 40 illustrated in FIG. 4 and FIG. 5, has properties enabling easy deformation in a direction perpendicular to a fold line, that is, in the X1-X2 direction and the Z1-Z2 direction, but uneasy deformation in a direction along the fold line, that is, in the Y1-Y2 direction. Accordingly, the elastic support member 40 elastically deforms in the X1-X2 direction due to expansion and contraction, and elastically deforms in the Z1-Z2 direction due to distortion, but the deformation in the Y1-Y2 direction is restrained.

In addition, the leaf spring having the folded structure, such as the elastic support member 40, in general, more easily elastically deforms in the X1-X2 direction due to expansion and contraction than in the Z1-Z2 direction due to distortion. For this reason, when an elastic modulus of the elastic support member 40 in the X1-X2 direction is regarded as a first elastic modulus, and the elastic modulus of the elastic support member 40 in the Z1-Z2 direction is regarded as a second elastic modulus, the first elastic modulus and the second elastic modulus become different values.

Further, in the elastic support member 40, the connecting part 45 is formed on the X1-direction side of one spring part 42, and the connecting part 45 is formed on the X2-direction side of the other spring part 42. Hence, the folded part 43c is located between the flat part 44b and the connecting part 45. A connecting claw 45a is provided on both ends along the connecting part 45 of the elastic support member 40, that is, on the Y1-direction end and on the Y2-direction end, and the elastic support member 40 can be mounted inside the casing body 10 by connecting the connecting claws 45a to the inner sides of the side faces in the lateral direction of the casing body 10. Accordingly, the elastic support member 40 is connected to the casing body 10, in a state elastically deformable in the X1-X2 direction and the Z1-Z2 direction with respect to the casing body 10.

Figure 6:
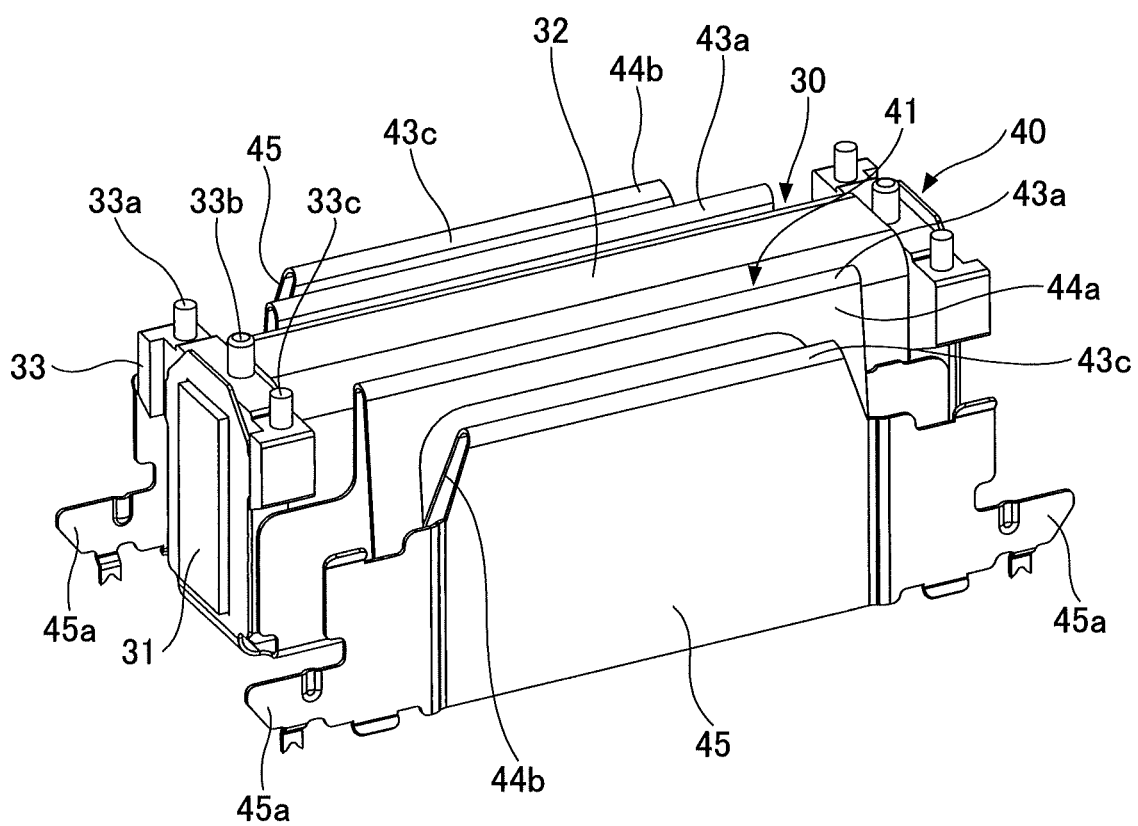
FIG. 6 is a perspective view of a state where the vibrator is inserted into the elastic support member according to one embodiment.
Figure 6:
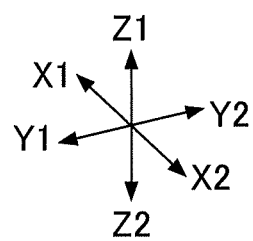
Figure 7:
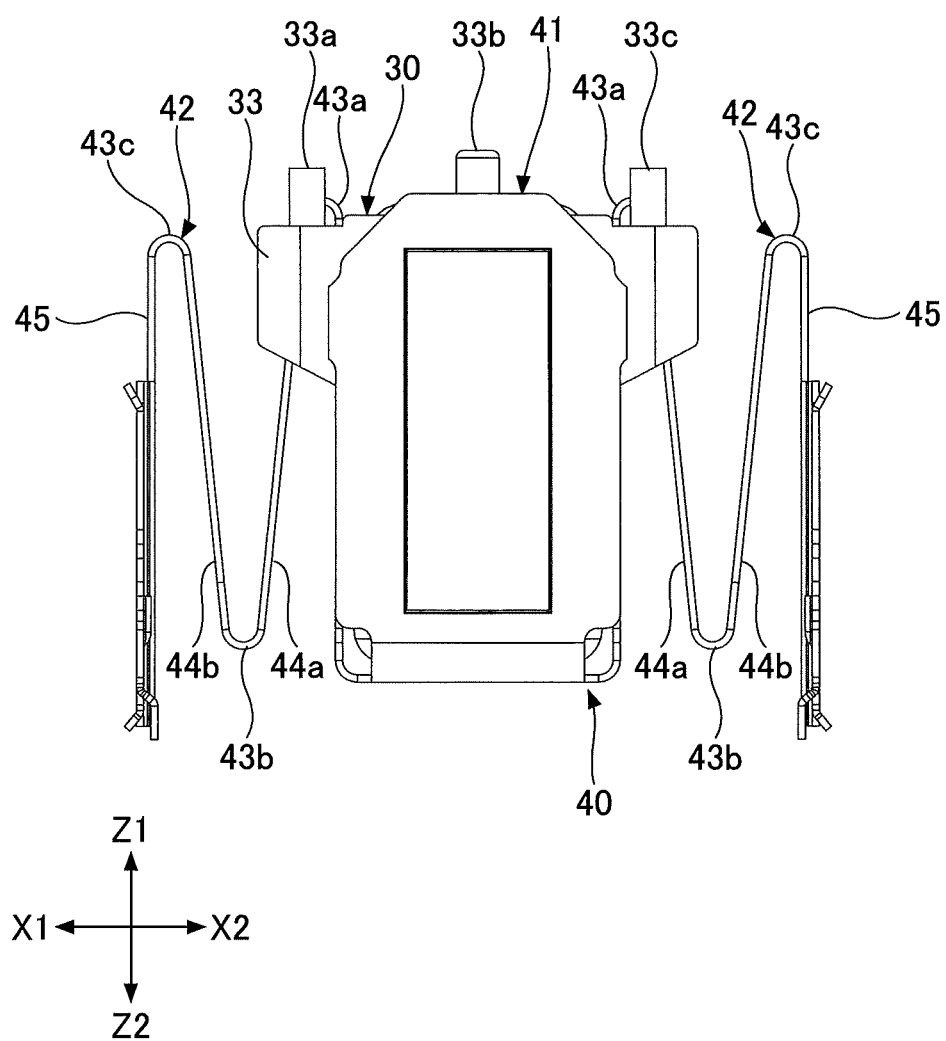
FIG. 7 is a front view of the state where the vibrator is inserted into the elastic support member according to one embodiment.

As illustrated in FIG. 6 and FIG. 7, the vibrator 30 is inserted into and held by the holder part 41 of the elastic support member 40. A structure in which the vibrator 30 is inserted into the holder part 41 of the elastic support member 40 vibrates in the X1-X2 direction at a first natural frequency that is determined by the first elastic modulus and a mass of the vibrator 30, and vibrates in the Z1-Z2 direction at a second natural frequency that is determined by the second elastic modulus and the mass of the vibrator 30. Because the first elastic modulus and the second elastic modulus have different values, the first natural frequency and the second natural frequency become different values.

The vibrator 30 that is formed by the electromagnet is magnetized to different polarities on both sides along the longitudinal direction of the magnetic core 31, because the magnetic field is generated when the current is supplied to the coil 32, and a magnetic flux is generated along the Y1-Y2 direction. That is, the magnetization polarity is different between the Y1-direction side and the Y2-direction side of the magnetic core 31. For this reason, when the alternating current is supplied to the coil 32, the generated magnetic field becomes an alternating magnetic field having a direction of the magnetic field that changes in correspondence with a change in the direction of the current. Accordingly, a state where the Y1-direction side of the magnetic core 31 becomes the S-pole and the Y2-direction side of the magnetic core 31 becomes the N-pole, and a state where the Y1-direction side of the magnetic core 31 becomes the N-pole and the Y2-direction side of the magnetic core 31 becomes the S-pole, are alternately repeated. A timing at which the alternating magnetic field is generated in the vibrator 30, and the frequency of the alternating magnetic field are controlled by the external circuit that is not illustrated and connected to the coil 32.

Figure 8:
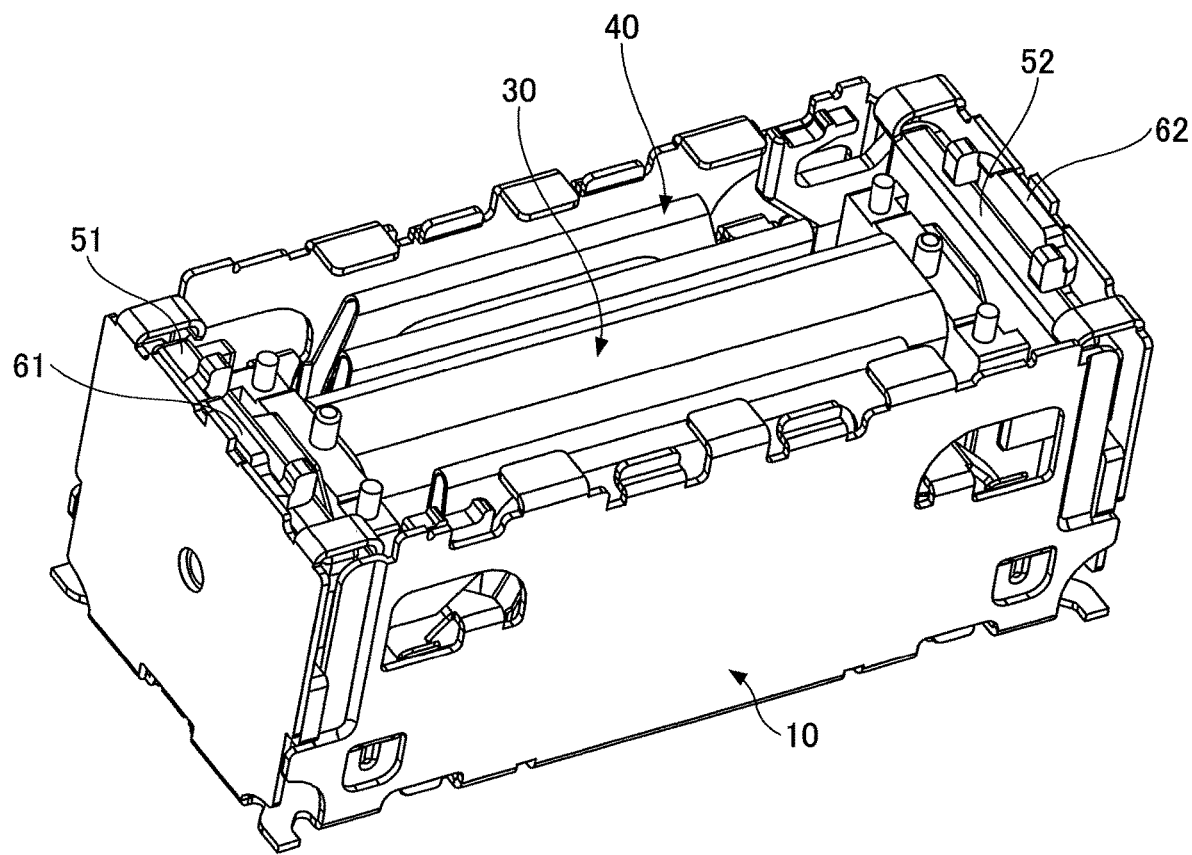
FIG. 8 is a perspective view illustrating a state inside the vibration generation device according to one embodiment.

In addition, the permanent magnets 51 and 52 are formed to approximately rectangular plate shapes. As illustrated in FIG. 8, the permanent magnets 51 and 52 are respectively provided within the casing body 10 along the longitudinal direction of the vibrator 30, that is, along an extension in the Y1-Y2 direction. More particularly, the permanent magnets 51 and 52 are respectively provided within the casing body 10 along the extension of the magnetic core 31 of the vibrator 30 in the Y1-Y2 direction, with the permanent magnet 51 provided along the extension of the magnetic core 31 of the vibrator 30 in the Y1-direction, and the permanent magnet 52 provided along the extension of the magnetic core 31 of the vibrator in the Y2-direction. A largest and approximately rectangular face of each of the permanent magnets 51 and 52 become the magnetized face, and the magnetized face of the permanent magnet 51 and the end face of the magnetic core 31 of the vibrator 30 along the Y1-direction oppose each other, while the magnetized face of the permanent magnet 52 and the end face of the magnetic core 31 of the vibrator 30 along the Y2-direction oppose each other. FIG. 8 is a perspective view of the vibration generation device according to one embodiment in a state where the lid 20 and the FPC 70 are removed, and illustrates the state inside the vibration generation device.

Figure 9:
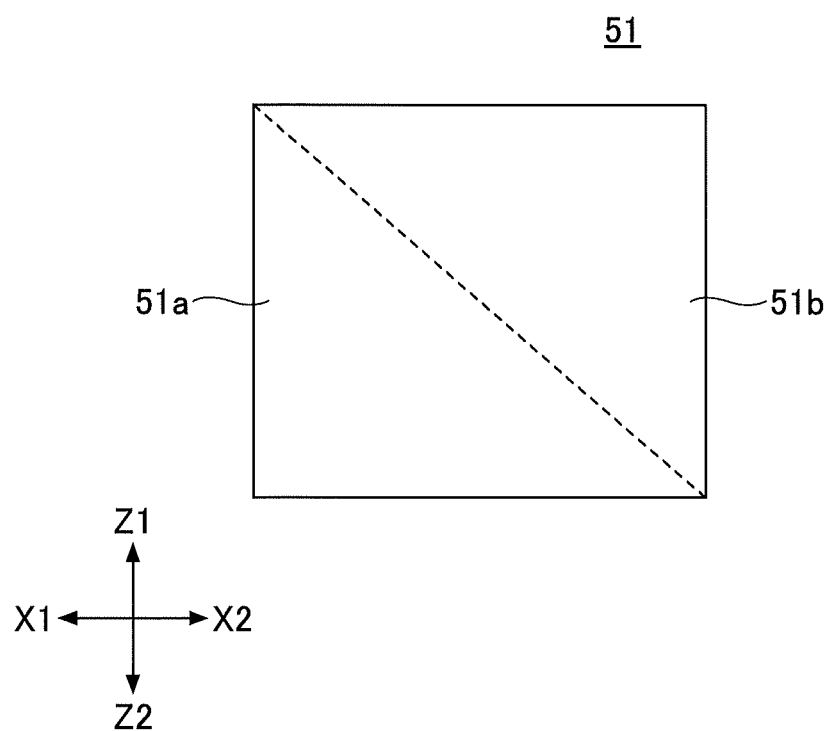
FIG. 9 is a diagram for explaining a permanent magnet according to one embodiment.

As illustrated in FIG. 9, each of the permanent magnets 51 and 52 is divided into two regions by a diagonal line extending from an upper left corner toward a lower right corner, as indicated by a dotted line, and the two regions are magnetized to mutually different polarities.

In this application, the lower left region of the permanent magnet 51, that is, the region in the X1-direction side and the Z2-direction side, is described as a first magnetized region 51a, and the upper right region of the permanent magnet 51, that is, the region in the X2-direction side and the Z1-direction side, is described as a second magnetized region 51b. The permanent magnet 51 is magnetized so that the first magnetized region 51a becomes the S-pole, and the second magnetized region 51b becomes the N-pole. The permanent magnet 52 is magnetized similarly, but to have different polarities. That is, although not illustrated, a first magnetized region and a second magnetized region are provided in the permanent magnet 52, and the permanent magnet 52 is magnetized so that the first magnetized region becomes the N-pole, and the second magnetized region becomes the S-pole.

Inside the casing body 10, the yoke 61 formed by a ferromagnetic material such as iron or the like, is provided on the outer side of the permanent magnet 51 in the Y1-direction, to guide the magnetic flux generated from the permanent magnet 51 toward the vibrator 30, and the yoke 62 formed by a ferromagnetic material such as iron or the like, is provided on the outer side of the permanent magnet 52 in the Y2-direction, to guide the magnetic flux generated from the permanent magnet 52 toward the vibrator 30.

Next, an operation of the vibration generation device according to one embodiment will be described, by referring to FIG. 10A through FIG. 11B. In the vibration generation device according to one embodiment, the alternating current is supplied to the coil 32 of the vibrator 30 that is formed by the electromagnet, to generate the alternating magnetic field, and so that both ends along the longitudinal direction of the magnetic core 31, that is, along the Y1-Y2 direction, are magnetized to the different polarities. The permanent magnet 51 and the permanent magnet 52 are arranged to oppose each other via the vibrator 30, with the first magnetized region 51 of the permanent magnet 51 opposing the first magnetized region of the permanent magnet 52, and the second magnetized region 51b of the permanent magnet 51 opposing the second magnetized region of the permanent magnet 52. Accordingly, the first magnetized region 51a of the permanent magnet 51 and the first magnetized region of the permanent magnet 52 that oppose each other are magnetized to mutually different polarities, and the second magnetized region 51b of the permanent magnet 51 and the second magnetized region of the permanent magnet 52 that oppose each other are magnetized to mutually different polarities.

Figure 10A:
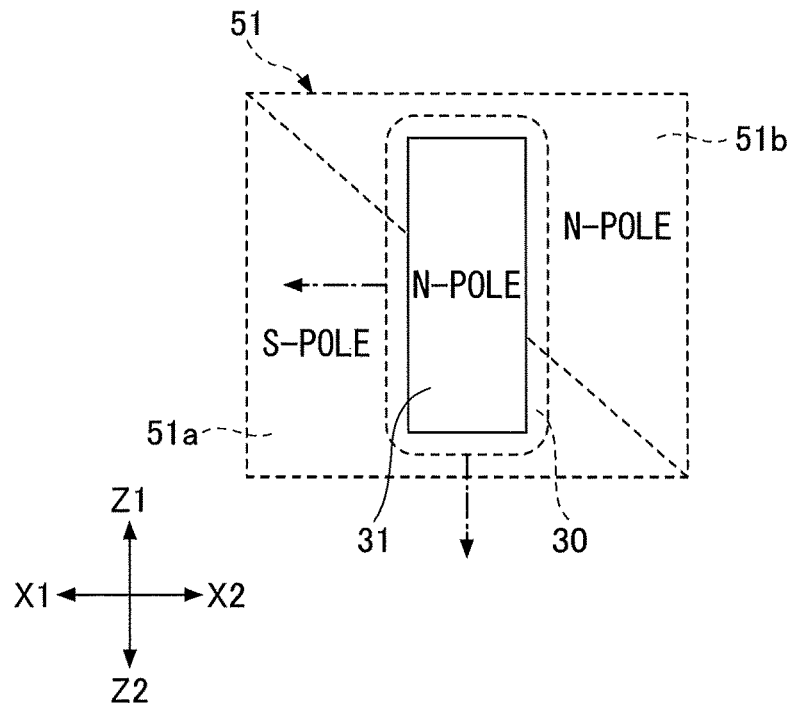
FIG. 10A is a diagram (1) for explaining an operation of the vibration generation device according to one embodiment.

In one embodiment, when the end of the magnetic core 31 of the vibrator 30 on the Y1-direction side is magnetized to the N-pole as illustrated in FIG. 10A, an attracting force that attracts toward the first magnetized region 51a of the permanent magnet 51, and a repulsive force that is repulsive to the second magnetized region 51b of the permanent magnet 51, are generated at the end of the magnetic core 31 on the Y1-direction side. In this case, although not illustrated, the end of the magnetic core 31 of the vibrator 30 on the Y2-direction side is magnetized to the S-pole, and thus, an attracting force that attracts toward the first magnetized region of the permanent magnet 52, and a repulsive force that is repulsive to the second magnetized region of the permanent magnet 52, are generated at the end of the magnetic core 31 on the Y2-direction side. Hence, the vibrator 30 moves toward the X1-direction and the Z2-direction, as indicated by a one-dot chain dashed arrow.

Figure 10B:
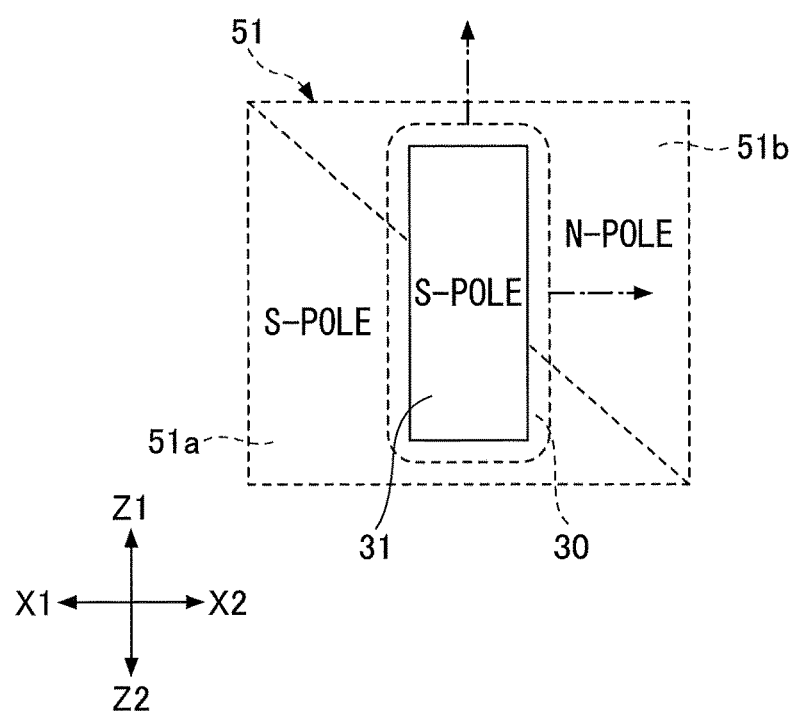
FIG. 10B is a diagram (2) for explaining the operation of the vibration generation device according to one embodiment.

In addition, when the end of the magnetic core 31 of the vibrator 30 on the Y1-direction side is magnetized to the S-pole as illustrated in FIG. 10B, a repulsive force that is repulsive to the first magnetized region 51a of the permanent magnet 51, and an attracting force that attracts toward the second magnetized region 51b of the permanent magnet 51, are generated at the end of the magnetic core 31 on the Y1-direction side. In this case, although not illustrated, the end of the magnetic core 31 of the vibrator 30 on the Y2-direction side is magnetized to the N-pole, and thus, a repulsive force that is repulsive to the first magnetized region of the permanent magnet 52, and an attracting force that attracts toward the second magnetized region of the permanent magnet 52, are generated at the end of the magnetic core 31 on the Y2-direction side. Hence, the vibrator 30 moves toward the X2-direction and the Z1-direction, as indicated by a one-dot chain dashed arrow.

Accordingly, in the vibration generation device according to one embodiment, the alternating magnetic field is generated by supplying the alternating current to the coil 32 of the vibrator 30 that is formed by the electromagnet, to generate the attracting force and the repulsive force between the permanent magnets, and generate the vibration by causing the vibrator 30 to repeat a movement in the X1-direction or the Z2-direction and a movement in the X2-direction or the Z1-direction.

The vibrator 30 is supported by the elastic support member 40 as described above, and vibrates along the X1-X2 direction at the first natural frequency determined in correspondence with the first elastic modulus and the mass of the vibrator 30, and vibrates along the Z1-Z2 direction at the second natural frequency determined in correspondence with the second elastic modulus and the mass of the vibrator 30.

Figure 11A:
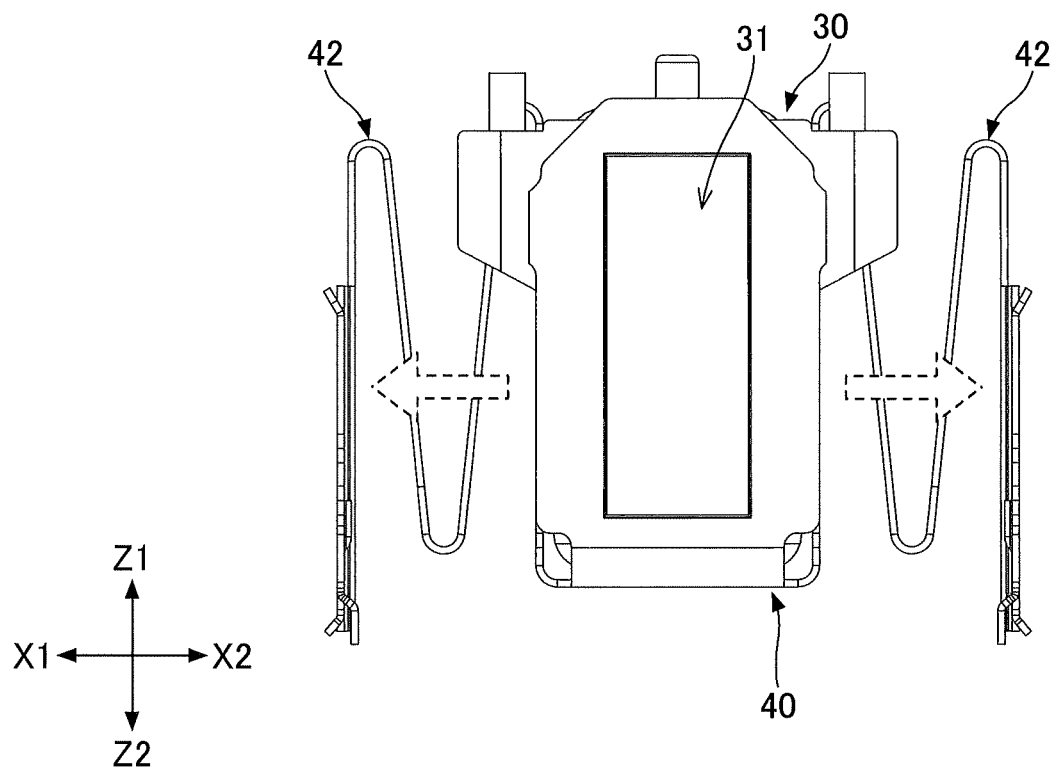
FIG. 11A is a diagram (3) for explaining the operation of the vibration generation device according to one embodiment.
Figure 11B:
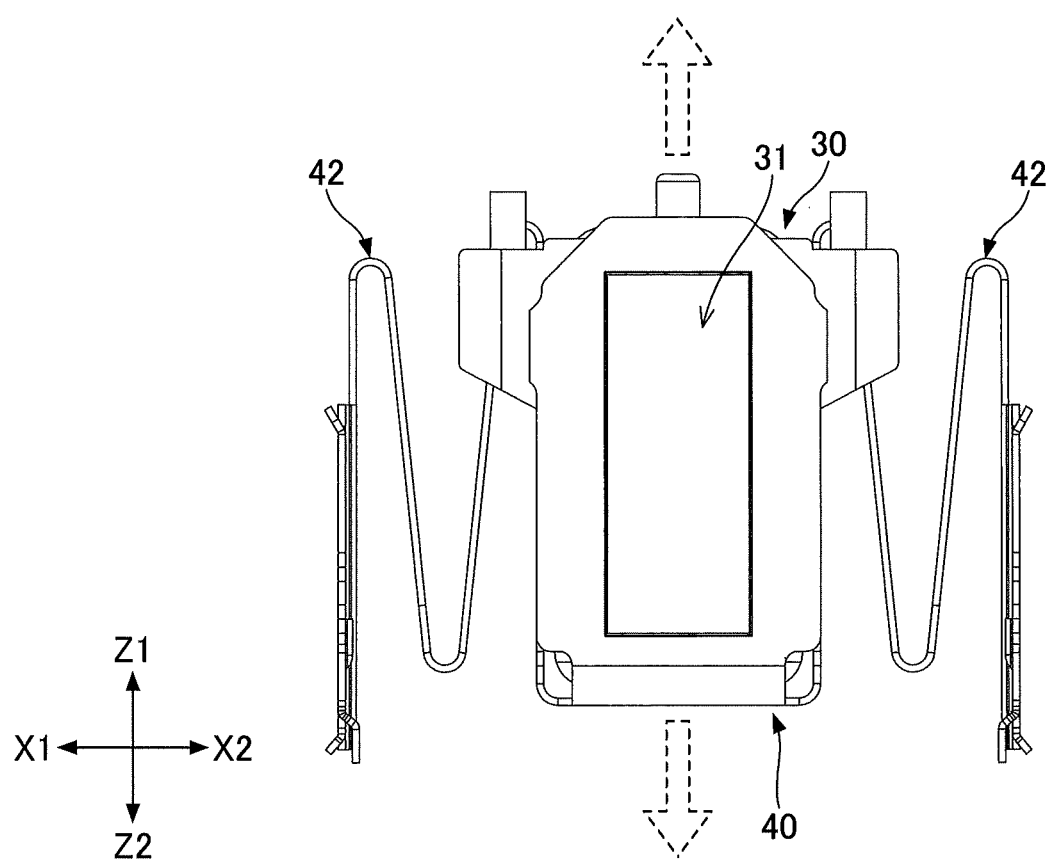
FIG. 11B is a diagram (4) for explaining the operation of the vibration generation device according to one embodiment.

When the alternating magnetic field having the same frequency as the first natural frequency is generated at the vibrator 30 that is formed by the electromagnet, the vibrator 30 easily vibrates in the X1-X2 direction, but uneasily vibrates in the Z1-Z2 direction, as illustrated in FIG. 11A. Accordingly, the vibrator 30 vibrates along the X1-X2 direction. In addition, when the alternating magnetic field having the same frequency as the second natural frequency is generated at the vibrator 30 that is formed by the electromagnet, the vibrator 30 easily vibrates in the Z1-Z2 direction, but uneasily vibrates in the X1-X2 direction, as illustrated in FIG. 11B. Accordingly, the vibrator 30 vibrates along the Z1-Z2 direction.

Hence, the vibration generation device according to one embodiment can vary the direction of the vibration between the vibration in the X1-X2 direction and the vibration in the Z1-Z2 direction, by varying the frequency of the alternating current supplied to the coil 32 of the vibrator 30.

In addition, the vibrator 30 that is provided inside the casing of the vibration generation device is connected to the external circuit that is not illustrated and is outside the casing, via the FPC 70. The FPC 70 has a structure in which interconnects formed by a metal are sandwiched by a resin material such as polyimide or the like, and the FPC 70 is flexible and can be deformed. For this reason, when parts of FPC inside the casing of the vibration generation device contact each other, frictional wear of the contacting parts of the FPC 70 may occur, to expose the interconnect forming the FPC 70, or to break the interconnect. Hence, in one embodiment, a support for supporting the FPC 70 is provided on the yoke 61, as will be described later.

Figure 12A:
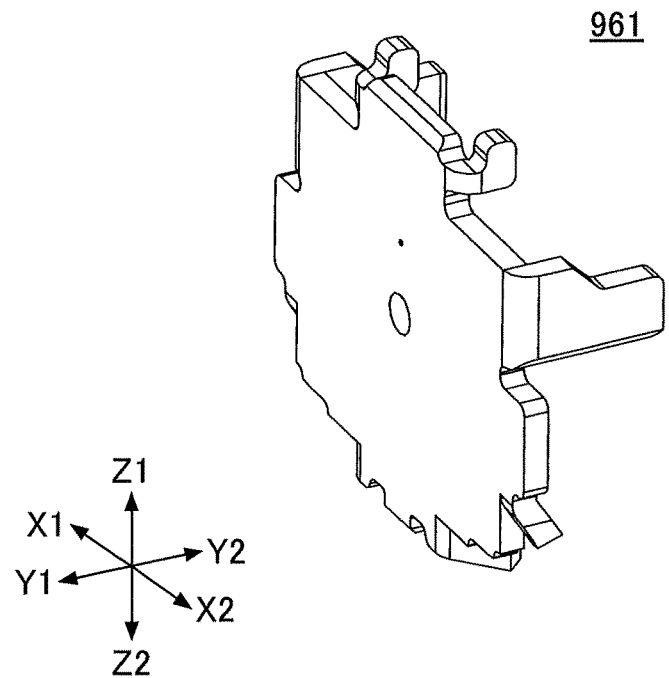
FIG. 12A is a diagram (1) for explaining a vibration generation device not provided with a support that supports a FPC.
Figure 12B:
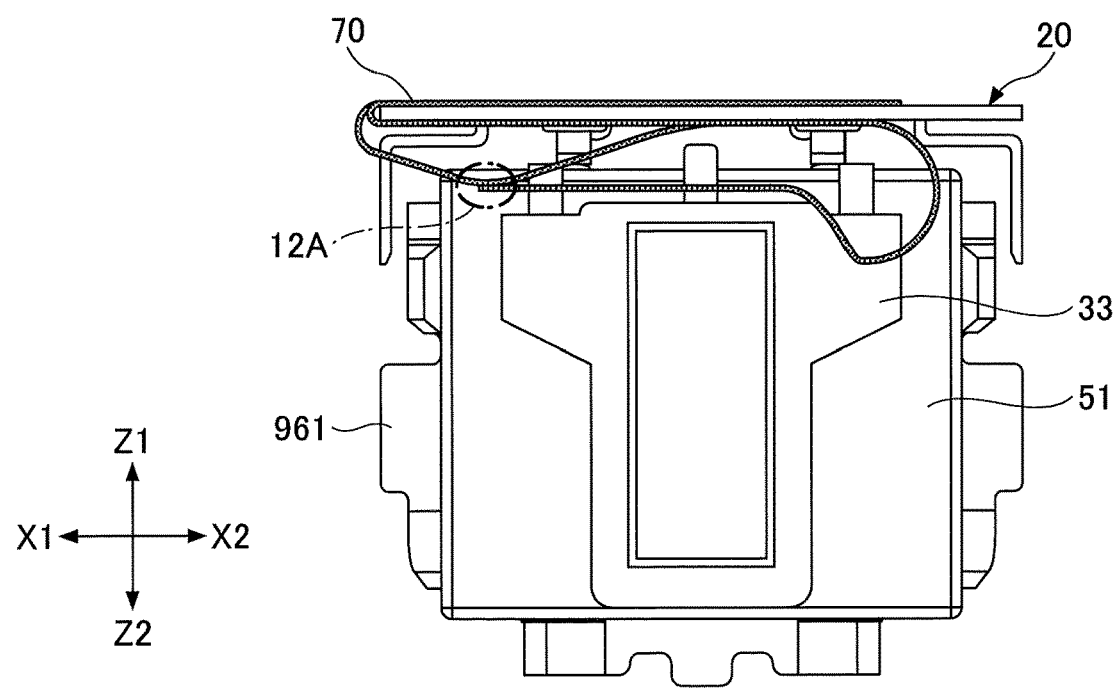
FIG. 12B is a diagram (2) for explaining the vibration generation device not provided with the support that supports the FPC.

More particularly, a vibration generation device that uses a yoke not provided with a support will be described for comparison purposes. FIG. 12A is a perspective view of a yoke 961 not provided with the support, and FIG. 12B is a cross sectional view of a body of the vibration generation device that uses this yoke 961. Because the FPC 70 is flexible, in the case of the vibration generation device that uses the yoke 961 not provided with the support, the FPC 70 is deformed in the folded state inside the casing, as illustrated in FIG. 12B, and the parts of the FPC 70 may contact each other at a part surrounded by a one-dot chain line 12A, or the FPC 70 may contact the casing or another member inside the casing, although not illustrated.

When the parts of the FPC 70 contact each other and the vibration generation device generates vibration larger than normal for a long period of time, or continues to generate the vibration greatly exceeding a designed life, the frictional wear of the contacting parts of the FPC 70 may occur, to expose an interconnect due to surface wear of the FPC 70, or to break the interconnect due to wear of the interconnect. As mentioned above, particularly in the vibration generation device capable of vibrating in two directions, namely, the X1-X2 direction and the Z1-Z2 direction, the vibration movement is complex, and the frictional wear may occur in a state where a force is applied to the contacting parts of the FPC 70, which may make the frictional wear more notable.

Figure 13A:
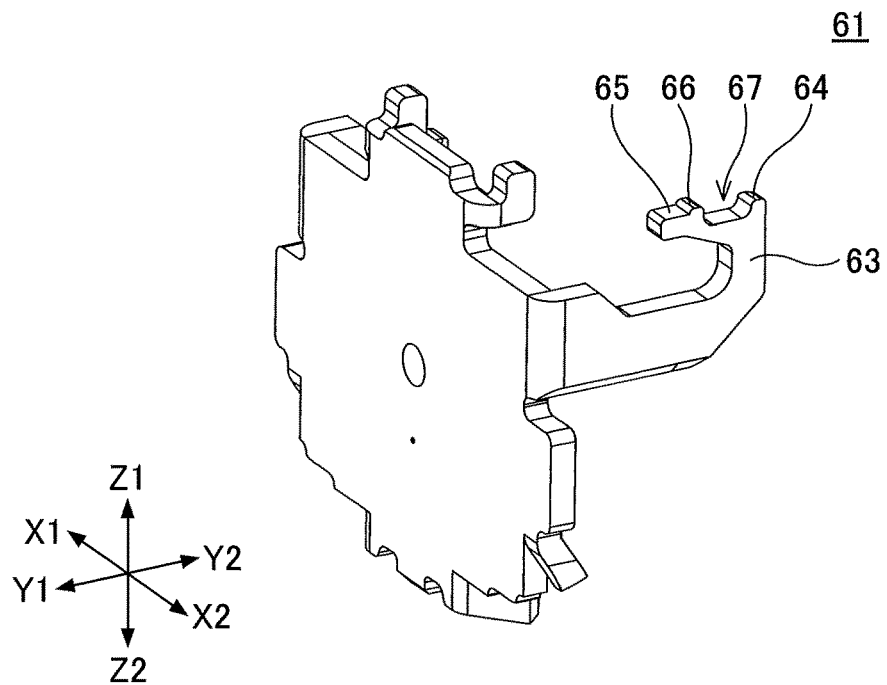
FIG. 13A is a diagram (1) for explaining a yoke according to one embodiment.
Figure 13B:
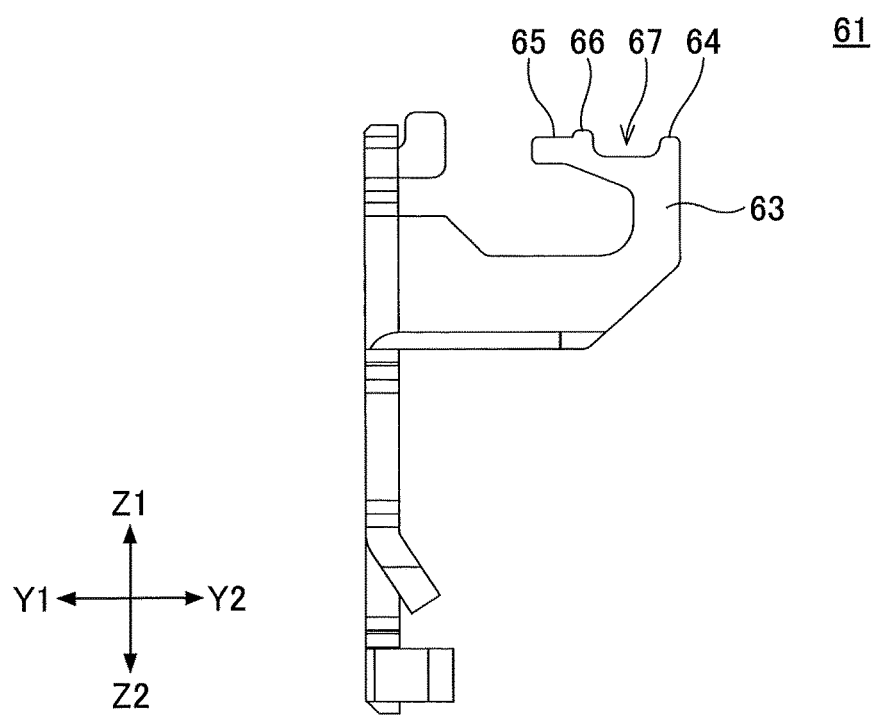
FIG. 13B is a diagram (2) for explaining the yoke according to one embodiment.
Figure 14:
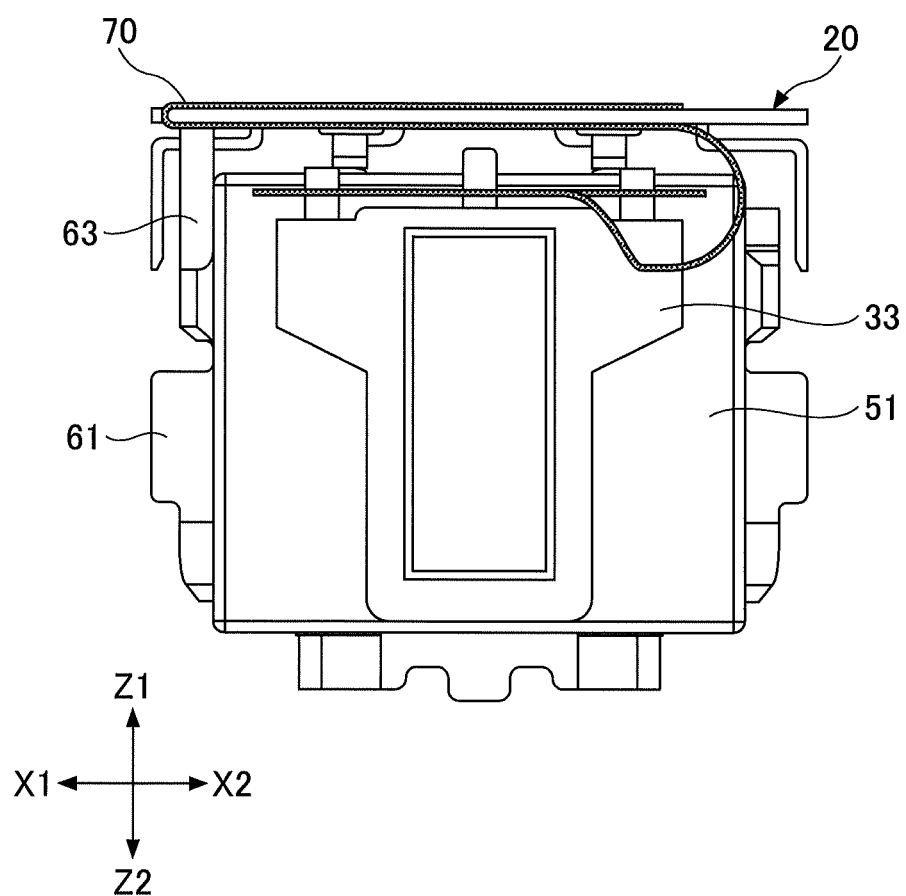
FIG. 14 is a diagram (1) for explaining the vibration generation device according to one embodiment.

On the other hand, in the vibration generation device according to one embodiment, a support 63 for supporting the FPC 70 is provided on the yoke 61, as illustrated in FIG. 13A and FIG. 13B. Hence, as illustrated in FIG. 14, the FPC 70 is supported by the support 63, to prevent parts of the FPC 70 from contacting each other. Accordingly, even when the vibration is generated by the vibration generation device according to one embodiment, parts of the FPC 70 do not contact each other, and the frictional wear of parts of the FPC 70 contacting each other will not occur, to consequently prevent the interconnect of the FPC 70 from becoming exposed or breaking. As a result, it is possible to improve the reliability of the vibration generation device, and further extend the life of the vibration generation device. The support for supporting the FPC 70 may be provided on members other than the yoke 61, such as the casing body 10 or the lid 20, for example, however, because the yoke 61 includes the function to guide the magnetic flux generated from the permanent magnet 51 toward the vibrator 30, the yoke 61 is formed to be thicker than the casing body 10 or the lid 20 in order to reduce the magnetic resistance, and the strength of the yoke 61 is high. Hence, the support for supporting the FPC 70 is preferably provided on the yoke 61. FIG. 14 is a schematic diagram, and the lower face (face facing the Z2-direction) of the lid 20 and the FPC 70 are not bonded, and thus, a slight gap is formed between the lower face of the lid 20 and the FPC 70. Because the FPC 70 that is folded to extend along the lid 20 is supported by the support 63 and is pressed against the lower face of the lid 20 due to the elasticity of the FPC 70, compared to providing the support on the casing body 10, the support 63 provided on the yoke 61, separated from an opening 11 of the casing body 10, can more effectively press the FPC 70 against the lid 20 using the elasticity of the FPC 70, and it is possible to further reduce the possibility of parts of the FPC 70 contacting each other.

Figure 15:
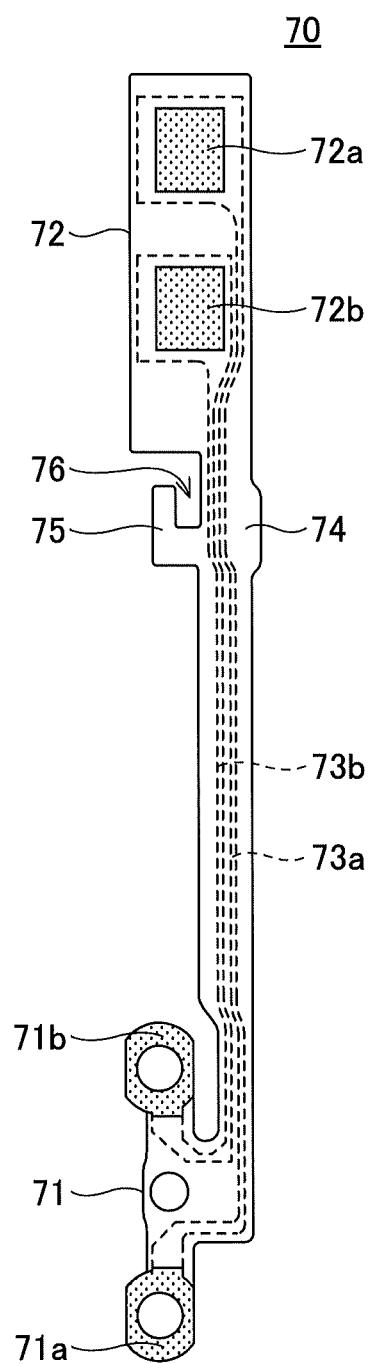
FIG. 15 is a diagram for explaining the FPC according to one embodiment.

One embodiment will be described in more detail. FIG. 15 is a diagram illustrating the entire structure of the FPC 70. Electrode terminals 71a and 71b are provided in one terminal region 71 on one side of the FPC 70, and electrode terminals 72a and 72b are provided in the other terminal region 72 on the other side of the FPC 70. The electrode terminal 71a and the electrode terminal 72a are connected via an interconnect 73a, and the electrode terminal 71b and the electrode terminal 72b are connected via an interconnect 73b. In the FPC 70, the interconnect 73a and the interconnect 73b, formed by a conductive metal, are sandwiched by the resin material such as polyimide or the like, and surfaces of the interconnects 73a and 73b are not exposed, but the electrode terminals 71a and 71b and the electrode terminals 72a and 72b are exposed to permit electrical connection.

A first supported part 74 and a second supported part 75, which are supported by the support 63 of the yoke 61, are provided between the one terminal region 71 provided on one side of the FPC 70 and the other terminal region 72 provided on the other side of the FPC 70. The first supported part 74 and the second supported part 75 are formed on both sides of the interconnect 73a and the interconnect 73b. That is, the interconnect 73a and the interconnect 73b are not formed on the first supported part 74 and the second supported part 75, and the interconnect 73a and the interconnect 73b pass between the first supported part 74 and the second supported part 75. In addition, a cutout 76, which is formed by cutting out a part of the FPC 70, is provided near the second supported part 75 on the side where the second supported part 75 is formed. This cutout 76 is formed between the interconnect 73b and the second supported part 75.

Although not illustrated, the electrode terminals 71a and 71b provided in the one terminal region 71 on one side of the FPC 70 are respectively connected to the projections 33a and 33c of the flange 33, by soldering or the like, and the ends of the wire forming the coil 32 are respectively connected to the projections 33a and 33c inside the casing. In addition, the other terminal region 72 of the FPC 70 is protrudes to the outside of the casing, and the face of the FPC 70, on the opposite side of the face provided with the electrode terminals 72a and 72b, is adhered on the outer face of the lid 20 using a double-sided adhesive tape that is not illustrated. Accordingly, the electrode terminals 72a and 72b in the other terminal region 72 on the other side of the FPC 70 are exposed at the outer side of the lid 20.

Next, the yoke 61 will be described, by referring to FIGS. 13A and 13B. The support 63, which extends toward the Y2-direction, is formed on the yoke 61. An end on the Z1-direction side of the support 63 of the yoke 61, that is, the end opposing the inner side of the lid 20, is provided with a first contact support 64 and a second contact support 65, and a convex part 66 that projects toward the Z1-direction and a concave part 67 that caves in toward the Z2-direction are provided between the first contact support 64 and the second contact support 65. That is, the first contact support 64, the concave part 67, the convex part 66, and the second contact support 65 are successively formed in this order in the Y2-Y1 direction, at the end on the Z1-direction side of the support 63 of the yoke 61.

Figure 16:
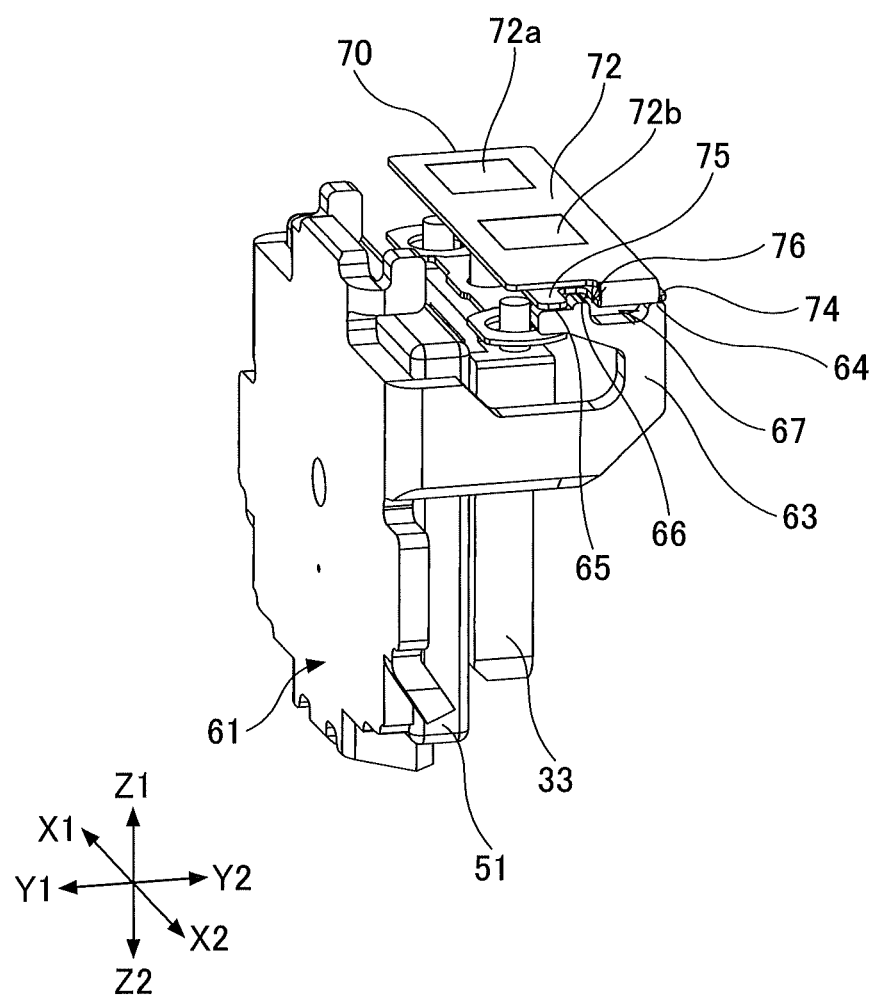
FIG. 16 is a diagram (2) for explaining the vibration generation device according to one embodiment.
Figure 17:
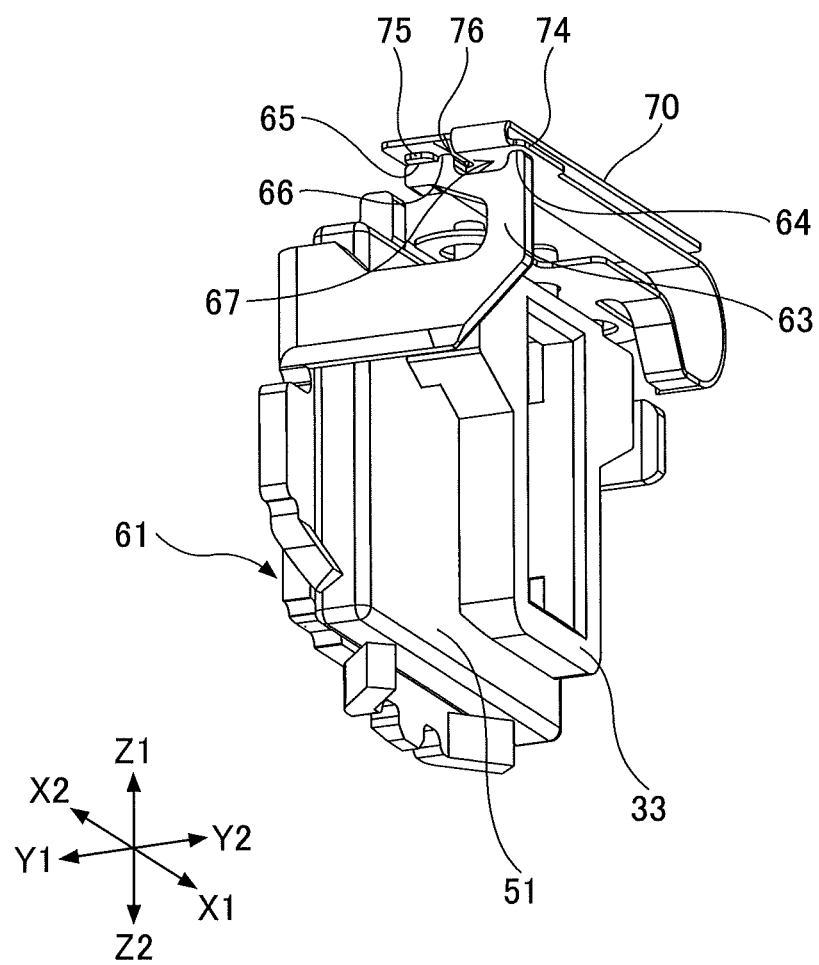
FIG. 17 is a diagram (3) for explaining the vibration generation device according to one embodiment.
Figure 18:
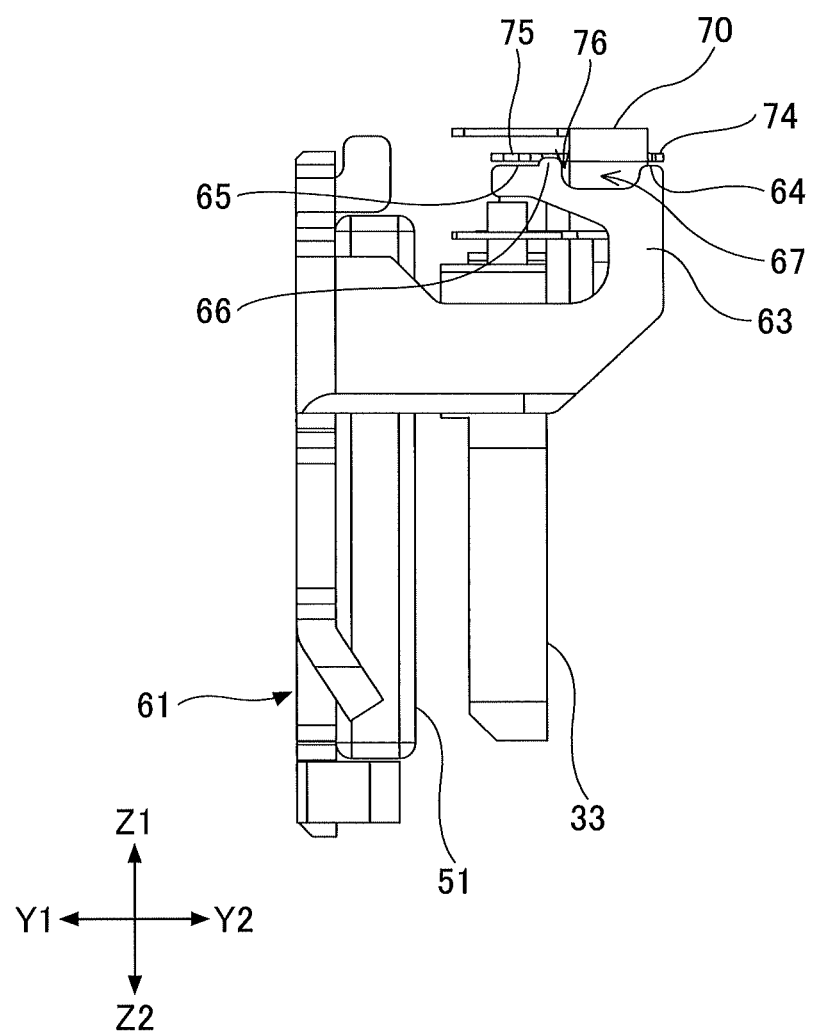
FIG. 18 is a diagram (4) for explaining the vibration generation device according to one embodiment.

Next, the support of the FPC 70 provided by the support 63 will be described, by referring to FIG. 16 through FIG. 18. FIG. 16 and FIG. 17 are perspective views from different directions, and FIG. 18 is a view from a side face. In one embodiment, the first supported part 74 of the FPC 70 is contacted and supported by the first contact support 64 provided on the support 63 of the yoke 61, and the second supported part 75 of the PFC 70 is contacted and supported by the second contact support 65, as illustrated in FIG. 16 through FIG. 18. For the sake of convenience, FIG. 18 or the like illustrate a state where the first contact support 64 of the yoke 61 and the first supported part 74 of the FPC 70 are separated, and the second contact support 65 of the yoke 61 and the second supported part 75 of the FPC 70 are separated, however, the corresponding contact support and supported part may actually make contact because the FPC 70 is flexible and easily deformable.

Figure 19:
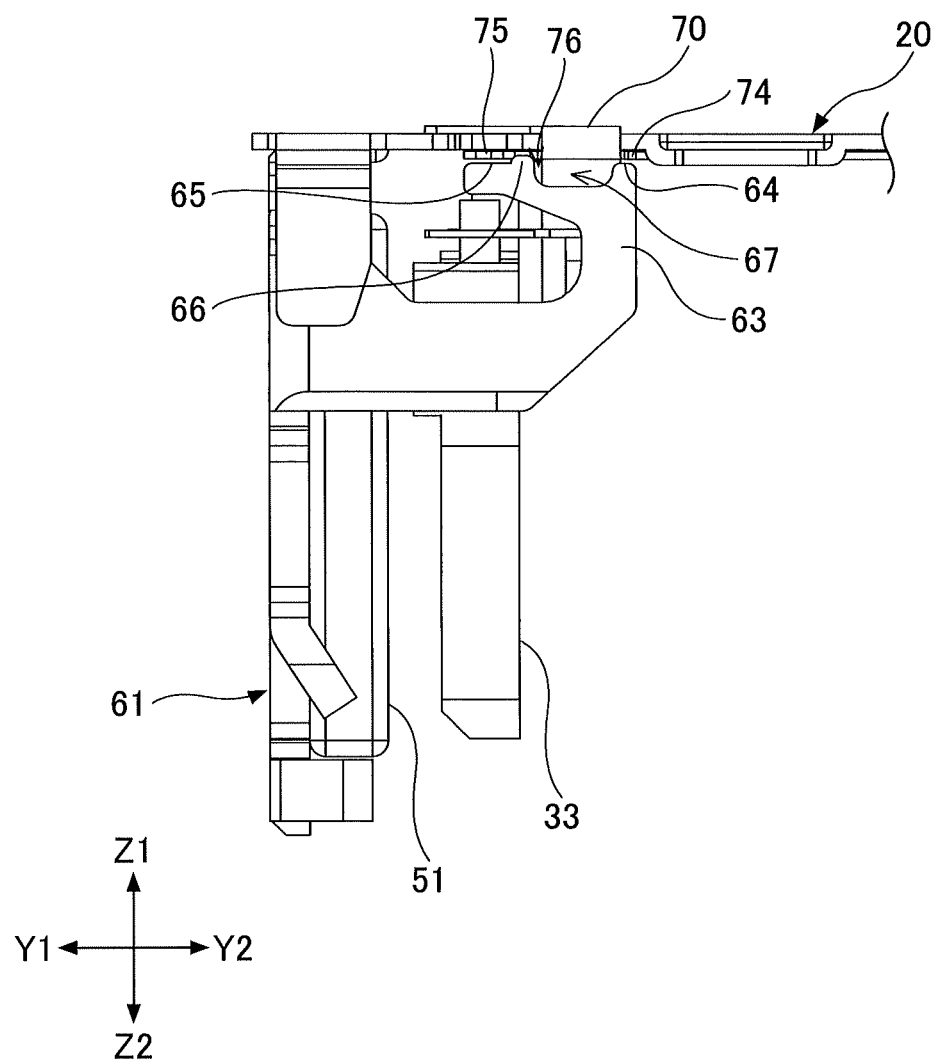
FIG. 19 is a diagram (5) for explaining the vibration generation device according to one embodiment.

Accordingly, as illustrated in FIG. 19, the first contact support 64 of the yoke 61 supports the first supported part 74 of the FPC 70 on the side toward the lid 20, and the second contact support 65 of the yoke 61 supports the second supported part 75 of the FPC 70 on the side toward the lid 20. For this reason, the first supported part 74 of the FPC 70 is positioned between the first contact support 64 of the yoke 61 and the inner side of the lid 20, and the second supported part 75 of the FPC 70 is positioned between the second contact support 65 of the yoke 61 and the inner side of the lid 20.

In one embodiment, the interconnects 73a and 73b are not formed on the first supported part 74 and the second supported part 75 of the FPC 70, and thus, even if the frictional wear of the first supported part 74 and the second supported part 75 of the FPC 70 in contact with the first contact support 64 and the second contact support 65 of the yoke 61 were to occur, the interconnects 73a and 73b of the FPC 70 would not become exposed or break.

In addition, in one embodiment, the concave part 67 of the support 63 of the yoke 61 is formed in correspondence with the region where the interconnects 73a and 73b of the FPC 70 are formed. This is to avoid contact between the support 63 of the yoke 61, and the region where the interconnects 73a and 73b of the FPC 70 are formed. When the region where the interconnects 73a and 73b of the FPC 70 are formed, and the support 63 of the yoke 61 do not make contact, even if the vibration generation device were to vibrate, the support 63 of the yoke 61 would not cause the frictional wear of the region where the interconnects 73a and 73b of the FPC 70 are formed. Further, the FPC 70 is provided so that the convex part 66 of the yoke 61 is inserted into the cutout 76 of the FPC 70. Consequently, the movement of the FPC 70 in the Y1-Y2 direction is restricted.

Figure 20:
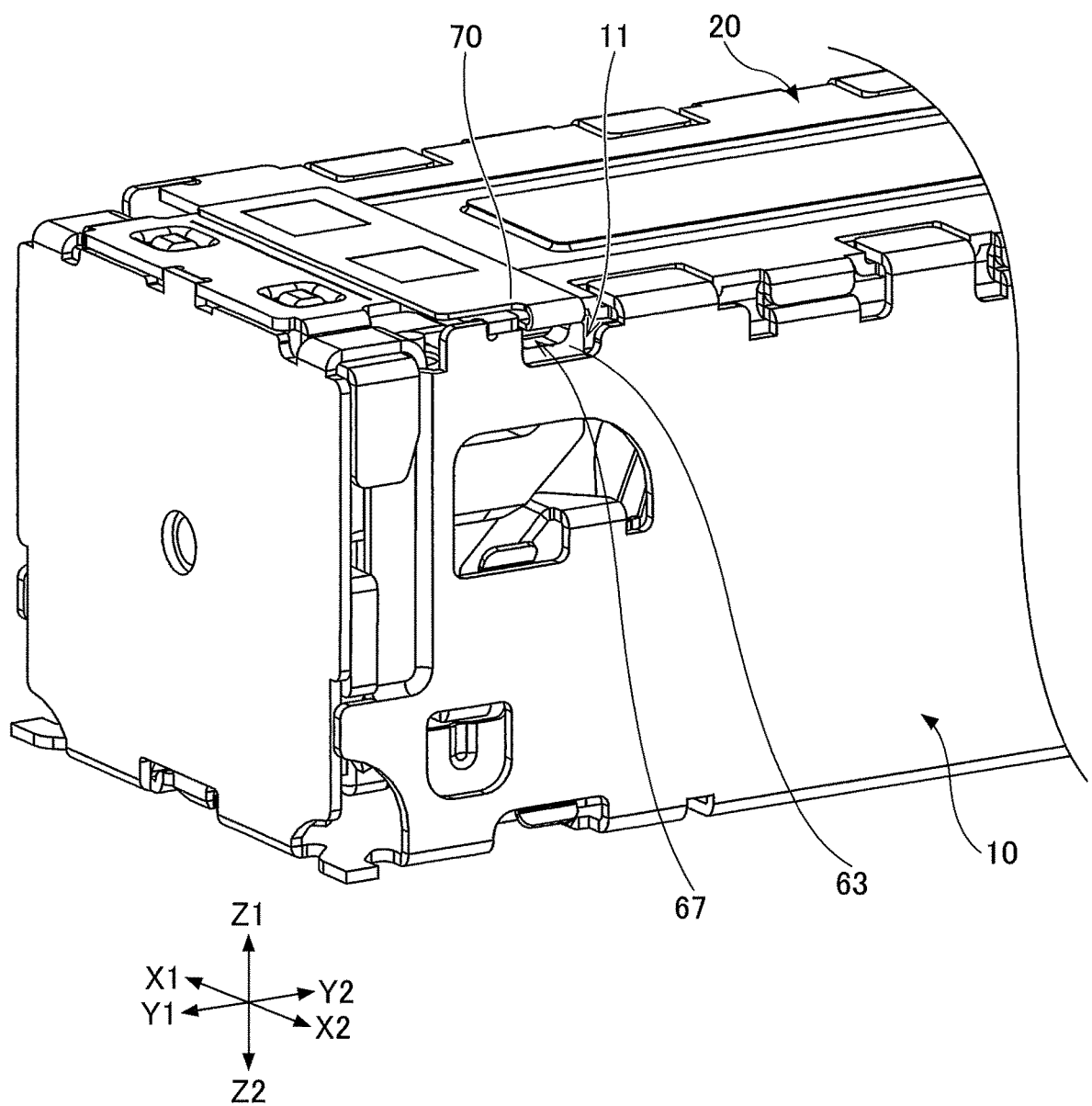
FIG. 20 is a diagram (6) for explaining the vibration generation device according to one embodiment.
Figure 21:
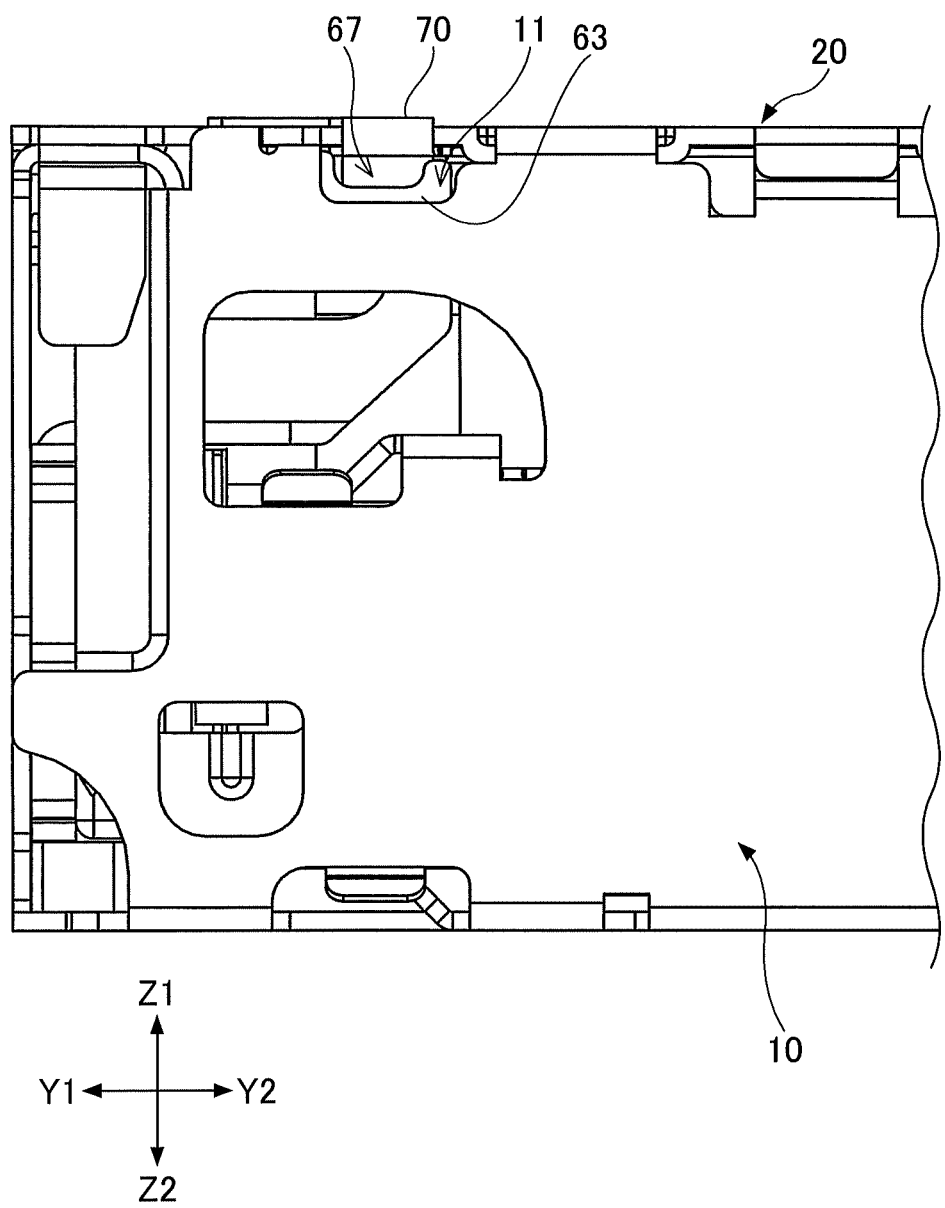
FIG. 21 is a diagram (7) for explaining the vibration generation device according to one embodiment.

In one embodiment, the opening 11 is provided between the casing body 10 and the lid 20, more particularly, on the side of the casing body 10 where the lid 20 connects, as illustrated in FIG. 20 and FIG. 21, and the FPC 70 is provided through this opening 11. In one embodiment, in order to avoid the FPC 70 making contact with the casing body 10, the opening 11 is formed to a width that is wider than a width of the concave part 67 of the support 63 of the yoke 61. More particularly, the opening 11 is formed in the side face of the casing body 10 along the longitudinal direction thereof, on the Z1-direction side, and is famed to the width that is wider in the Y1-Y2 direction than the concave part 67 of the support 63 of the yoke 61.

Figure 22:
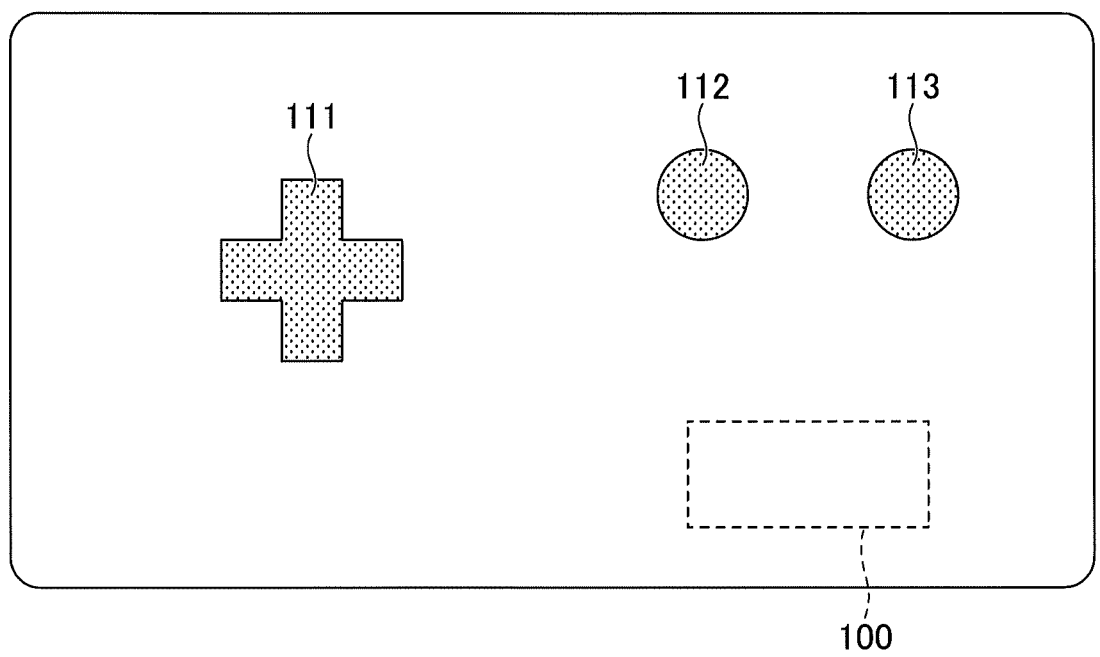
FIG. 22 is a diagram for explaining an electronic apparatus according to one embodiment.

The vibration generation device 100 according to one embodiment is used in the electronic apparatus, such as a controller or the like of a game console illustrated in FIG. 22, for example. In the electronic apparatus, such as the controller or the like of the game console, the vibration generation device 100 according to one embodiment is provided inside the electronic apparatus such as the controller or the like of the game console, together with required electronic components or the like, and operating parts 111, 112, and 113 for performing operations are provided on the outer side of the electronic apparatus such as the controller or the like of the game console.

According to the disclosed vibration generation device, it is possible to obtain a high reliability in the vibration generation device using the FPC or the like.

Although embodiments are described above in detail, the embodiments are non-limiting, and various variations and modifications may be made within the scope recited in the claims. For example, the current supplied to the coil 32 may be a direct current having a rectangular pulse waveform that switches between on and off states at predetermined timings, instead of supplying the alternating current. In this case, the vibration along the X1-X2 direction, or along the Z1-Z2 direction, may be generated by supplying the pulse current at the frequency corresponding to the first natural frequency or the second natural frequency.

What is claimed is:

1. A vibration generation device comprising:
   a casing;
   a magnet mounted inside the casing;
   a vibrator that includes a coil and vibrates inside the casing;
   an elastic support member that is connected to the casing and supports the vibrator inside the casing; and
   a flexible interconnect member having one end connected to a wire of the coil, and the other end protruding outside the casing,
   wherein the casing is provided with an opening through which the interconnect member passes, and
   wherein the interconnect member is supported by a support inside the casing.

2. The vibration generation device as claimed in claim 1, further comprising:
   a yoke that passes a magnetic flux from the magnet,
   wherein the support is provided on the yoke.

3. The vibration generation device as claimed in claim 2, wherein the interconnect member is a flexible printed circuit.

4. The vibration generation device as claimed in claim 3, wherein the support supports a region of the flexible printed circuit excluding a region where an interconnect of the flexible printed circuit is famed.

5. The vibration generation device as claimed in claim 4, wherein:
   a first contact support and a second contact support that make contact with the flexible printed circuit are provided on the support,
   a first supported part and a second supported part are provided on both sides of the interconnect of the flexible printed circuit,
   the first contact support contacts and supports the first supported part of the flexible printed circuit, and
   the second contact support contacts and supports the second supported part of the flexible printed circuit.

6. The vibration generation device as claimed in claim 5, wherein a concave part, corresponding to a region where an interconnect of the flexible printed circuit is formed, is provided between the first contact support and the second contact support of the support.

7. The vibration generation device as claimed in claim 6, wherein a width of the opening provided in the casing is wider than a width of the concave part.

8. The vibration generation device as claimed in claim 5, wherein:
   a convex part is provided on a side of the support provided with the first contact support and the second contact support,
   a cutout corresponding to the convex part is provided in the flexible printed circuit, and
   the convex part is inserted into the cutout.

9. The vibration generation device as claimed in claim 1, wherein the interconnect member is a flexible printed circuit.

10. The vibration generation device as claimed in claim 9, wherein:
    a first contact support and a second contact support that make contact with the flexible printed circuit are provided on the support,
    a first supported part and a second supported part are provided on both sides of the interconnect of the flexible printed circuit,
    the first contact support contacts and supports the first supported part of the flexible printed circuit, and
    the second contact support contacts and supports the second supported part of the flexible printed circuit.

11. An electronic apparatus comprising:
    a vibration generation device according to claim 1.

12. The electronic apparatus as claimed in claim 11, wherein the vibration generation device further includes a yoke that passes a magnetic flux from the magnet, and wherein the support is provided on the yoke.

13. The electronic apparatus as claimed in claim 12, wherein the interconnect member is a flexible printed circuit.

* * * * *